United States Patent
Kubota et al.

(10) Patent No.: US 9,461,238 B2
(45) Date of Patent: Oct. 4, 2016

(54) PIEZOELECTRIC THIN FILM, PIEZOELECTRIC ELEMENT, AND MANUFACTURING METHOD THEREOF

(75) Inventors: Makoto Kubota, Yokohama (JP); Kenichi Takeda, Yokohama (JP); Jumpei Hayashi, Chofu (JP); Mikio Shimada, Kawasaki (JP); Yuichi Shimakawa, Ibaraki (JP); Masaki Azuma, Yokohama (JP); Yoshitaka Nakamura, Osaka (JP); Masanori Kawai, Ikoma (JP)

(73) Assignees: CANON KABUSHIKI KAISHA, Tokyo (JP); KYOTO UNIVERSITY, Kyoto-Shi (JP)

( * ) Notice: Subject to any disclaimer, the term of this patent is extended or adjusted under 35 U.S.C. 154(b) by 514 days.

(21) Appl. No.: 13/581,429

(22) PCT Filed: Feb. 28, 2011

(86) PCT No.: PCT/JP2011/055153
§ 371 (c)(1),
(2), (4) Date: Aug. 27, 2012

(87) PCT Pub. No.: WO2011/108732
PCT Pub. Date: Sep. 9, 2011

(65) Prior Publication Data
US 2012/0319533 A1    Dec. 20, 2012

(30) Foreign Application Priority Data
Mar. 2, 2010  (JP) .................. 2010-045907

(51) Int. Cl.
*H01L 41/18*  (2006.01)
*H01L 41/187*  (2006.01)
(Continued)

(52) U.S. Cl.
CPC ........ *H01L 41/1878* (2013.01); *B41J 2/14233* (2013.01); *H01L 41/0478* (2013.01);
(Continued)

(58) Field of Classification Search
CPC ..... H01L 41/187; H01L 41/18; H01L 41/22; H01L 41/45
USPC .................................................. 310/357, 358
See application file for complete search history.

(56) References Cited

U.S. PATENT DOCUMENTS 7,238,978 B2   7/2007  Miyazawa et al.
7,436,013 B2   10/2008  Miyazawa et al.
(Continued)

FOREIGN PATENT DOCUMENTS

JP   2005-011931 A   1/2005
JP   2006-269391 A   10/2006
JP   2007-287739 A   11/2007

OTHER PUBLICATIONS

Office Action in Japanese Application No. 2010-045907 (dispatched Jan. 28, 2014).
(Continued)

*Primary Examiner* — Shawki S Ismail
*Assistant Examiner* — Bryan Gordon
(74) *Attorney, Agent, or Firm* — Fitzpatrick, Cella, Harper & Scinto (57) ABSTRACT

Provided are a piezoelectric thin film having good piezoelectricity in which a rhombohedral structure and a tetragonal structure are mixed, and a piezoelectric element using the piezoelectric thin film. The piezoelectric thin film includes a perovskite type metal oxide, in which the perovskite type metal oxide is a mixed crystal system of at least a rhombohedral structure and a tetragonal structure, and a ratio between an a-axis lattice parameter and a c-axis lattice parameter of the tetragonal structure satisfies $1.15 \leq c/a \leq 1.30$. The piezoelectric element includes on a substrate: the above-mentioned piezoelectric thin film; and a pair of electrodes provided in contact with the piezoelectric thin film.

12 Claims, 4 Drawing Sheets

(51) Int. Cl.
*B41J 2/14* (2006.01)
*H01L 41/047* (2006.01)
*H01L 41/08* (2006.01)
*H01L 41/318* (2013.01)
*H02N 2/10* (2006.01)
*H02N 2/16* (2006.01)
*H01L 41/09* (2006.01)

(52) U.S. Cl.
CPC ......... *H01L41/081* (2013.01); *H01L 41/0973* (2013.01); *H01L 41/318* (2013.01); *H02N 2/106* (2013.01); *H02N 2/163* (2013.01); *Y10T 29/42* (2015.01)

(56) References Cited

U.S. PATENT DOCUMENTS

| | | | | |
|---|---|---|---|---|
| 2004/0209402 | A1* | 10/2004 | Chai et al. | 438/122 |
| 2005/0218756 | A1* | 10/2005 | Fujii et al. | 310/358 |
| 2006/0183249 | A1 | 8/2006 | Yao et al. | |
| 2007/0111335 | A1* | 5/2007 | Miyazawa | H01L 21/31691 438/3 |
| 2008/0211881 | A1* | 9/2008 | Ifuku et al. | 347/70 |
| 2008/0218559 | A1* | 9/2008 | Fujii | B41J 2/14233 347/68 |
| 2008/0297005 | A1* | 12/2008 | Sakashita | B41J 2/14233 310/330 |
| 2009/0108706 | A1* | 4/2009 | Okuno | H01L 41/0805 310/311 |
| 2009/0315432 | A1* | 12/2009 | Furuta | C01G 23/002 310/358 |
| 2010/0231095 | A1* | 9/2010 | Kubota et al. | 310/357 |
| 2011/0007115 | A1* | 1/2011 | Kobayashi | B41J 2/14233 347/68 |
| 2011/0079883 | A1 | 4/2011 | Shimada et al. | |
| 2011/0193451 | A1* | 8/2011 | Watanabe et al. | 310/358 |
| 2011/0221302 | A1 | 9/2011 | Yabuta et al. | |

OTHER PUBLICATIONS

Office Action in Korean Application No. 10-2012-7024730 (mailed Apr. 14, 2014).

R. J. Zeches et al., "A Strain-Driven Morphotropic Phase Boundary in BiFeO3," 326(5955) Science 977-980 (Nov. 2009) (XP055000523).

Yoshitaka Nakamura et al., "Enhanced Piezoelectric Constant of (1-x)BiFeO3-xBiCoO3 Thin Films Grown on LaAlO3 Substrate," 50 Jpn. J. Appl. Phys. 031505/1-4 (Mar. 2011) (XP055000525).

X.D. Zhang et al., "Low-temperature Preparation of Highly (100)-oriented Pb(ZrxTi1-x)O3 Thin Film by High Oxygen-pressure Processing," 86(25) Appl. Phys. Lett. 252902/1-3 (Jun. 2005) (XP012065951).

X. Qi et al., "Multi-Ferroic BiFeO3 Films Prepared by Liquid Phase Epitaxy and Sol-gel Methods" 162 Ceramic Transactions 69-73 (2005) (XP009149217).

Masaki Azuma et al., "Rhombohedral-Tetragonal Phase Boundary with High Curie Temperature in (1-x)BiCoO3-xBiFeO3 Solid Solution," 47(9) Jpn. J. Appl. Phys. 7579-7581 (2008).

Shintaro Yasui et al., "Crystal Structure Analysis of Epitaxial BiFeO3-BiCoO3 Solid Solution Films Grown by Metalorganic Chemical Vapor Deposition," 46(10B) Jpn. J. Appl. Phys. 6948-6951 (2007).

Communication Pursuant to Article 94(3) EPC in European Application No. 11709223.9 (dated Aug. 31, 2015).

* cited by examiner

PIEZOELECTRIC THIN FILM, PIEZOELECTRIC ELEMENT, AND MANUFACTURING METHOD THEREOF

TECHNICAL FIELD

The present invention relates to a piezoelectric thin film, a piezoelectric element, a manufacturing method for the piezoelectric element, a liquid discharge head, and an ultrasonic motor. In particular, the present invention relates to a lead-free piezoelectric thin film with piezoelectricity improved by control of the crystal structure.

BACKGROUND ART

A piezoelectric element is typically formed of a bulk-shaped or film-shaped piezoelectric material including a lower electrode and an upper electrode.

As a piezoelectric material, $ABO_3$ type ceramics such as lead zirconate titanate (hereinafter, referred to as "PZT") is generally used.

However, PZT contains lead at an A-site of a perovskite skeleton. Therefore, the environmental impact of the lead component is considered to be a problem. In order to address this problem, a piezoelectric material using a lead-free perovskite type metal oxide has been proposed.

A typical lead-free piezoelectric material is $BiFeO_3$ (hereinafter, referred to as "BFO"), which is a perovskite type metal oxide.

For example, PTL (Patent Literature) 1 discloses a BFO-based material containing lanthanum at its A-site. BFO is a good ferroelectric, and it has been reported that the amount of remanent polarization of BFO measured at low temperature is high. However, there remains a problem that sufficient piezoelectric strain cannot be obtained from BFO.

Aimed at an attempt to enhance the ferroelectric characteristics of a memory element using BFO, PTL 2 discloses an approach to substituting Co at the B-site of BFO at a ratio of 1% to 10%. In the conventional method of manufacturing a BFO thin film, however, impurity phases other than the perovskite structure are increased with the substitution of Co, which causes a problem of low piezoelectricity.

NPL (Non Patent Literature) 1 discloses a BFO thin film, which introduces a pseudo-morphotropic phase boundary by epitaxy (described therein as a combination of epitaxial growth techniques). The pseudo-morphotropic phase boundary as used therein is a mechanism for the reversible transformation between a pseudo-rhombohedral phase (described therein as a rhombohedral-like phase) and a pseudo-tetragonal phase (described therein as a tetragonal-like phase). However, there is a small volume difference between a unit cell of the pseudo-rhombohedral phase and a unit cell of the pseudo-tetragonal phase, with the result that sufficient piezoelectric strain have not been obtained so far.

CITATION LIST

Patent Literature

PTL 1: Japanese Patent Application Laid-Open No. 2007-287739
PTL 2: Japanese Patent Application Laid-Open No. 2005-011931

Non Patent Literature

NPL 1: "Science", 2009, vol. 326, pp. 977 to 980

SUMMARY OF INVENTION

Technical Problem

The present invention has been made to deal with the above-mentioned problem, and provides a piezoelectric thin film having good piezoelectricity in which a rhombohedral structure and a tetragonal structure are mixed.

Further, the present invention provides a piezoelectric element using the piezoelectric thin film, a manufacturing method for the piezoelectric element, a liquid discharge head, and an ultrasonic motor.

Solution to Problem

In order to solve the above-mentioned problem, a piezoelectric thin film includes a perovskite type metal oxide, in which the perovskite type metal oxide is a mixed crystal system of at least a rhombohedral structure and a tetragonal structure, and a ratio between an a-axis lattice parameter and a c-axis lattice parameter of the tetragonal structure satisfies $1.15 \leq c/a \leq 1.30$.

In order to solve the above-mentioned problem, a piezoelectric element includes on a substrate: the above-mentioned piezoelectric thin film; and a pair of electrodes provided in contact with the piezoelectric thin film.

In order to solve the above-mentioned problem, a manufacturing method for a piezoelectric element including, on a substrate, a piezoelectric thin film and a pair of electrodes provided in contact with the piezoelectric thin film, includes: forming a first electrode on the substrate, the substrate being a single-crystal substrate selectively oriented in a (100) plane, in which an in-plane lattice parameter of a unit cell of the single-crystal substrate is 0.360 nm or more to 0.385 nm or less in a surface of the single-crystal substrate; forming the piezoelectric thin film on the first electrode; and forming a second electrode on the piezoelectric thin film, in which the forming the piezoelectric thin film includes applying a precursor solution of an organometallic compound to the single-crystal substrate, followed by drying, and heating the single-crystal substrate at 430° C. or lower under an excess oxygen atmosphere, thereby obtaining a thin film formed of a crystallized metal oxide.

A liquid discharge head for solving the above-mentioned problem includes the above-mentioned piezoelectric element.

An ultrasonic motor for solving the above-mentioned problem includes the above-mentioned piezoelectric element.

Advantageous Effects of Invention

According to the present invention, the piezoelectric thin film having good piezoelectricity can be provided. Further, the present invention can provide the piezoelectric element including the above-mentioned piezoelectric thin film, the manufacturing method for the piezoelectric element, the liquid discharge head, and the ultrasonic motor.

Further features of the present invention will become apparent from the following description of exemplary embodiments with reference to the attached drawings.

DESCRIPTION OF EMBODIMENTS

Now, embodiments of the present invention are described in detail below.

The present invention provides a novel piezoelectric thin film having good piezoelectric characteristics. Taking advantage of the characteristics of a dielectric, the piezoelectric thin film according to the present invention can be used in various applications, including a capacitor material, a memory material, and a sensor material.

The piezoelectric thin film according to the present invention is a piezoelectric thin film made of a perovskite type metal oxide, in which the crystal system of the perovskite type metal oxide is a mixed crystal system of at least a rhombohedral structure and a tetragonal structure, and the ratio between the a-axis lattice parameter and the c-axis lattice parameter of the tetragonal structure satisfies $1.15 \leq c/a \leq 1.30$.

The "perovskite type metal oxide" as used herein refers to a metal oxide having a perovskite type structure as described in Iwanami Dictionary of Physics and Chemistry, 5th Edition (Iwanami Shoten, Publishers, Feb. 20, 1998). The metal oxide having the perovskite type structure is generally represented by the chemical formula $ABO_3$. The elements A and B in the perovskite type oxide each act in the form of an ion and occupy specific positions of a crystal unit cell called A-site and B-site, respectively. In a unit cell of a cubic crystal system for example, the element A is positioned at a vertex of a cube and the element B is positioned at the body center of the cube. The elements O act as oxygen anions and occupy face-centered positions.

Three axes along the sides of a unit cell are called a-axis, b-axis, and c-axis. In a cubic, tetragonal, or orthorhombic unit cell, the three axes are perpendicular to one another. Commonly, the c-axis is an axis with the highest symmetry, such as the long side of a square prism. The length of each axis is called axis lattice parameter. The a-axis lattice parameter and the b-axis lattice parameter are herein considered to be substantially the same.

Herein, types of crystal systems, such as a rhombohedral structure and a tetragonal structure, are defined as follows. The following symbols "=" and "≠" represent a substantially equal relation and an unequal relation, respectively. The β angle represents an angle formed by the a-axis and the b-axis of a crystal lattice.

Rhombohedral crystal: a-axis lattice parameter=c-axis lattice parameter, and β angle≠90°

Tetragonal crystal: a-axis lattice parameter≠c-axis lattice parameter, and β angle=90°

The crystal system of the piezoelectric thin film according to the present invention is a mixed crystal system of at least the rhombohedral structure and the tetragonal structure. In the mixed crystal system, larger piezoelectric effects are generated by an external electric field. This results from the switching from the polarization moment in the (001) axis direction of the tetragonal structure to the polarization moment in the (111) axis direction of the rhombohedral structure.

This switching phenomenon may occur in other crystal systems than the mixed crystal system as in the present invention. However, energy barriers for the switching are so high that the switching occurs infrequently and the level of contribution to piezoelectricity is low.

Note that, it can easily be confirmed that the crystal system of the piezoelectric thin film is a mixed crystal system of the rhombohedral structure and the tetragonal structure, based on a detection angle of the diffraction peak in X-ray diffraction measurement (e.g., 2θ/θ method or reciprocal lattice mapping), which is commonly used for crystal thin films. In other words, if the crystal system of the piezoelectric thin film is a mixed crystal system of the rhombohedral structure and the tetragonal structure, the diffraction peaks of detection angles are relegated into a diffraction peak resulting from the tetragonal structure and a diffraction peak resulting from the rhombohedral structure. It can easily be determined as the mixed crystal system if the integrated intensity ratio between the diffraction peak resulting from the tetragonal structure and the diffraction peak resulting from the rhombohedral structure is 0.01 or more to 100 or less. Note that, the integrated intensity ratio in the same plane approximates the volume ratio between the structures.

Meanwhile, the co-existence of two crystal systems in a static state as in the present invention suggests that mutual energy states be close to each other. In other words, the energy barriers for switching are so reduced that the switching occurs frequently, with the result that piezoelectricity is enhanced.

In the piezoelectric thin film according to the present invention, the ratio between the a-axis lattice parameter and the c-axis lattice parameter of the tetragonal structure satisfies $1.15 \leq c/a \leq 1.30$, more preferably $1.16 \leq c/a \leq 1.26$. The value of c/a is larger than 1.15, which means that an aspect ratio as a square prism is large enough. Because the value of c/a of the rhombohedral structure is 1, a large shape difference is caused between both structures when the switching occurs therebetween. Taking advantage of the synergistic effect of the large shape difference and the frequent switching described above, the piezoelectric thin film according to the present invention has high piezoelectricity.

From the above-mentioned reason, it is preferred that the aspect ratio c/a be high. However, if c/a exceeds 1.30, it may become difficult to maintain the perovskite type structure, and the shape difference may become large to reduce the frequency of switching between the structures.

Further, it is preferred that the above-mentioned perovskite type metal oxide contain a metal oxide represented by the following general formula (1).

$$Bi_x(M_{1-y}Co_y)O_3 \qquad \text{General formula (1)}$$

where M represents at least one kind of metal selected from Fe and Al, and x and y satisfy $0.95 \leq x \leq 1.25$ and $0.05 \leq y \leq 0.15$.

In the general formula (1), bismuth (Bi) is a metallic element that is mainly positioned at the A-site, and iron (Fe), aluminum (Al), and cobalt (Co) are elements that are each mainly positioned at the B-site.

The site A is formed of Bi as a trivalent metallic element, thereby allowing the perovskite structure including the A-site element and the O element to be electrically more stable.

Further, when the A-site is occupied by only Bi, the symmetry of the perovskite skeleton constituted by the A-site element and the elements O is increased to improve the stability in a piezoelectric material to external stimulus. In addition, the strong bonding inherent in Bi provides the effects of increasing the Curie temperature of the piezoelectric material and widening a variation of internal polarization.

In the general formula (1), x representing the composition of Bi satisfies $0.95 \leq x \leq 1.25$, preferably $0.98 \leq x \leq 1.15$. If x is less than 0.95, the insulation property is adversely affected by defect sites because of a deficiency of Bi. On the other hand, if x is more than 1.25, an excessive amount of bismuth oxide precipitates at a grain boundary, which is responsible for current leakage under high voltage application.

The metal oxide represented by the general formula (1) can be interpreted as a solid solution of $Bi_xMO_3$ and $Bi_xCoO_3$. When M is Fe, a $Bi_xFeO_3$ itself is a stable rhombohedral structure. When M is Al, a simple substance of $Bi_xAlO_3$ is difficult to synthesize at normal pressure but is a stable rhombohedral structure in the high-pressure phase. A simple substance of $Bi_xCoO_3$ is difficult to synthesize at normal pressure but is a stable tetragonal structure with a high aspect ratio in the high-pressure phase. In other words, the general formula (1) is a solid solution of a rhombohedral-structured material and a tetragonal-structured material, and is a composition with large piezoelectricity taking advantage of the above-mentioned switching mechanism of polarization moments.

In the general formula (1), y representing the compositions of M and Co satisfies $0.05 \leq x \leq 0.15$, more preferably $0.08 \leq y \leq 0.12$. If the value of y satisfies $0.05 \leq y \leq 0.15$, a mixed crystal system of a tetragonal structure with a high aspect ratio and a rhombohedral structure is more easily obtained. If y is less than 0.05, the crystal system of the piezoelectric thin film may have only the rhombohedral structure. If y is more than 0.15, the crystal system of the piezoelectric thin film may have only the tetragonal structure.

In the metal oxide represented by the general formula (1), it is more preferred that the metal M be Fe. $Bi_xFeO_3$ has a more stable rhombohedral structure. Besides, $Bi_xFeO_3$ is excellent in solubility to $Bi_xCoO_3$ and forms a homogeneous solid solution.

The above-mentioned values of x and y in the piezoelectric thin film according to the present invention can be confirmed by elemental analysis, such as energy-dispersive X-ray spectroscopy (EDX), X-ray fluorescence analysis (XRF), or inductively coupled plasma (ICP) emission spectrometry.

The piezoelectric thin film according to the present invention may be doped with a trace amount of an element other than Bi, Fe, and Co as long as its piezoelectricity and insulation property are not impaired. Specific examples of the element used as a dopant for doping include Ca, Sr, Ba, Sn, La, Th, Y, Sm, Ce, Ti, Sb, Nb, Ta, W, Mo, Cr, Ni, Cu, Si, Ge, Sc, Mg, Mn, and Zr. The amount of the dopant is 0.05 or less in terms of atomic fraction with respect to the total number of atoms of the metallic elements in the general formula (1).

Further, when the piezoelectric thin film according to the present invention has the composition represented by the general formula (1), the piezoelectric thin film also functions as a multiferroic material having both ferroelectricity and ferromagnetism. The mixed crystal system of the rhombohedral structure and the tetragonal structure with a high aspect ratio like the present invention provides another effect of enhancing the remanent magnetization of the multiferroic material, namely magnetic memory performance.

Further, it is preferred that the tetragonal structure of the piezoelectric thin film be selectively (001) oriented, and that the rhombohedral structure of the piezoelectric thin film be selectively (100) oriented. Note that, the phrase "selectively (hkl) oriented" as used herein refers to the state in which the degree of orientation in the (hkl) plane is higher than the degree of orientation in other planes. The phrase can be translated as a phrase "preferentially oriented in the (hkl) plane". This also comprehends an exactly (hkl) oriented state like a single crystal.

The (001) oriented tetragonal structure is in the state in which the c-axis is oriented in the thickness direction. The rhombohedral structure is described above as being (100) oriented because no distinction is made between the a-axis and the c-axis in general, but it is intended that the rhombohedral structure is c-axis oriented similar to the tetragonal structure. When the tetragonal structure and the rhombohedral structure in the piezoelectric thin film are oriented in the same direction, the directions of polarization moments are aligned with the strain direction of the piezoelectric thin film, thereby increasing the distortion amount in the use of a piezoelectric element. In particular the case of c-axis orientation, it is possible to make the most of the strain resulting from a high aspect ratio of the tetragonal structure.

The orientation state of the piezoelectric thin film can easily be confirmed based on the detection angle and intensity of the diffraction peak in X-ray diffraction measurement (e.g., $2\theta/\theta$ method), which is commonly used for crystal thin films. For example, in a diffraction chart obtained from the piezoelectric thin film according to the present invention, in which the c-axis is oriented in the thickness direction, the intensity of a diffraction peak detected at an angle corresponding to the (001) plane of the tetragonal structure or the (100) plane of the rhombohedral structure is extremely large as compared with a total intensity of peaks detected at angles corresponding to other planes.

Further, it is preferred that at least one of the part of the tetragonal structure and the part of the rhombohedral structure of the piezoelectric thin film form a columnar structure. The columnar structure is intended to a state in which unit cells of one crystal structure are aggregated to grow in the thickness direction and an alternate structure is formed in the plane together with the aggregate of unit cells of the other crystal structure, when viewed from the cross-section of the piezoelectric thin film according to the present invention. This state can be identified by observation using a transmission electron microscope (hereinafter, referred to as TEM). There are different electron diffraction intensities between the part of the tetragonal structure with a high aspect ratio as in the present invention and the part of the rhombohedral structure, with the result that a contrast difference (gray-level difference) appears. An electron diffraction pattern is obtained from one of the regions and compared with a diffraction pattern calculated from the crystal structure model. This way, the crystal structure can be identified. Alternatively, the crystal structure can also be identified using a high-resolution TEM image (hereinafter, referred to as lattice image). The lattice image exhibits a periodic contrast corresponding to a periodic crystal structure. By subjecting the lattice image to fast Fourier transform, an FFT pattern corresponding to the electron diffraction pattern is obtained. Similarly to the above-mentioned electron diffraction pattern, the crystal structure can be identified through analysis of the FFT pattern.

The part of the tetragonal structure and the part of the rhombohedral structure are phase-separated so that at least one thereof forms a columnar structure, to thereby maintain a stable mixed crystal system of both structures.

The thickness of the piezoelectric thin film according to the present invention is not particularly limited, but desirably 50 nm or more to 10 µm or less for example. Setting the thickness of the piezoelectric material to 50 nm or more to 10 µm or less provides a function of the piezoelectric material, and processability of a film for manufacture of the element is also expected.

The thickness of the piezoelectric thin film according to the present invention is preferably 100 nm or more to 1000 nm or less, more preferably 100 nm or more to 750 nm or less. When the shape of the thin film is not flat and hence the thickness cannot be determined to be a single value, the average of thicknesses between two electrodes, which practically function as the piezoelectric thin film upon manufacture of the element, has only to be set to fall within the above-mentioned range. When the thickness of the piezoelectric thin film according to the present invention is set to 100 nm or more, a sufficient strain amount required for a piezoelectric element can be obtained. When the thickness is set to 1000 nm or less, an increase in integrate density upon manufacture of the element is expected. In addition, the above-mentioned thickness range exerts an enlarged synergistic effect with a surface roughness range to be described later.

Note that, the "thin film" as used herein may be of such a form as to cover one surface of a substrate, or may be of such a form as to aggregate in a foil fashion independently.

Further, it is preferred that a root mean square roughness Rq of the surface of the piezoelectric thin film and y in the general formula (1) satisfy the relationship of the following general formula (2).

$$0 < Rq \leq 25y+2 \qquad \text{General Formula (2)}$$

The general formula (2) means that the surface of the piezoelectric thin film according to the present invention is excellent in smoothness. When the surface of the piezoelectric thin film is smooth, high insulation property is expected. The upper limit of the surface roughness for maintaining the insulation property is determined by the function of y representing the composition amount of Co in the general formula (1).

The "root mean square roughness Rq" as used herein refers to one described in JIS Standard B0601 (revised edition of 2001) and is represented by the following equation:

$$Rq = \sqrt{\frac{1}{l} \int_0^l Z^2(x) dx}$$

where l is a reference length, x is a coordinate representing an arbitrary position, and Z(x) is the height of a roughness curve at the coordinate x. A method of deriving the Rq is not limited as long as the method is in conformance with the standard. For example, a method involving calculating the Rq from the height difference of the surface of the thin film scanned with an atomic force microscope (AFM) is generally adopted.

When the surface of the piezoelectric thin film is covered with a member such as an electrode, a root mean square height Pq of a sectional curve obtained from the cross-sectional shape of the surface of the film may be used instead.

In the present invention, the Rq of the surface of the thin film of 25y+2 or less is a factor for enhancing the insulation property of the piezoelectric thin film. As the amount of the Co component increases, the size of a crystal grain of the BFCO itself increases, and hence an allowable Rq increases.

When the Rq is 25y+2 or less, the piezoelectric thin film according to the present invention has sufficient insulation property, but it is preferred that the Rq be as small as possible, for example, 20y+2 or less because a higher insulation property can be expected.

The Rq necessarily takes a positive value because a crystal grain in the piezoelectric thin film according to the present invention cannot be completely flat. Further, it is preferred that the piezoelectric thin film be provided on a substrate, that the substrate be a single-crystal substrate selectively (100) oriented, and that an in-plane lattice parameter of a unit cell of the single-crystal substrate is 0.360 nm or more to 0.385 nm or less in a surface of the single-crystal substrate.

Because the piezoelectric thin film according to the present invention is provided on the substrate, the stability in the form of the thin film can be expected. When the substrate is a single-crystal substrate selectively (100) oriented, the piezoelectric thin film provided on the substrate surface can also be selectively oriented in the same orientation. When the piezoelectric thin film is selectively oriented, the polarization moments are aligned in the thickness direction to expect the enhancement of the piezoelectric effects. In particular the case where the in-plane lattice parameter of the single-crystal substrate is 0.360 nm or more to 0.385 nm or less in the substrate surface, there is obtained an effect of suppressing the a-axis lattice parameter of a unit cell of the metal oxide during epitaxial growth of the perovskite type metal oxide according to the present invention. A unit cell has a fixed number of metallic elements contained therein, and hence the unit cell of the tetragonal structure elongates the c-axis lattice parameter so as to maintain its volume. In other words, the growth or existence of the tetragonal structure with a high aspect ratio (c/a) is expected.

If the in-plane lattice parameter is less than 0.360 nm, the a-axis lattice parameter is so suppressed that the impurity phase may be generated in the perovskite type structure. On the contrary, if the in-plane lattice parameter is more than 0.385 nm, the effect of suppressing the a-axis lattice parameter cannot be expected.

Next, a piezoelectric element according to the present invention is described. The piezoelectric element according to the present invention includes on a substrate: the piezoelectric thin film above mentioned; and a pair of electrodes provided in contact with the piezoelectric thin film.

Figure 1:
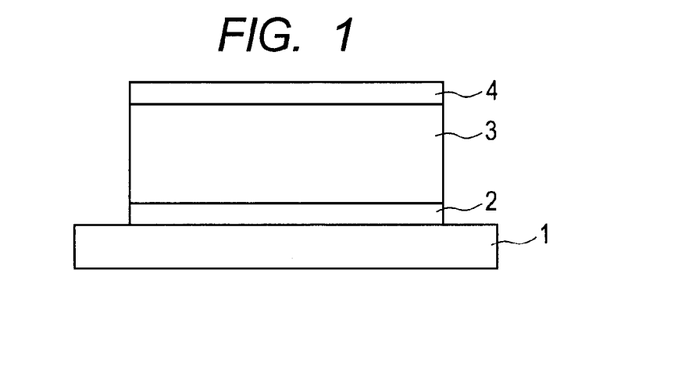
FIG. 1 is a schematic view in vertical cross-section illustrating an exemplary embodiment of a piezoelectric element according to the present invention.

FIG. 1 is a schematic view in vertical cross-section illustrating an exemplary embodiment of the piezoelectric element according to the present invention. In FIG. 1, the piezoelectric element includes a substrate 1, a lower electrode 2, a piezoelectric thin film 3, and an upper electrode 4. The piezoelectric element according to the present invention includes, on the substrate 1, the piezoelectric thin film 3 and a pair of the lower electrode 2 and the upper electrode 4 provided in contact with the piezoelectric thin film 3.

The substrate 1 includes a single-crystal substrate selectively (100) oriented, and an in-plane lattice parameter of a unit cell of the single-crystal substrate is 0.360 nm or more to 0.385 nm or less in a surface of the single-crystal substrate.

If the in-plane lattice parameter in the substrate surface of the single-crystal substrate is 0.360 nm or more to 0.385 nm or less, a compressive stress is generated in each of the a-axis direction and the b-axis direction of a unit cell of a metal oxide constituting the piezoelectric thin film according to the present invention. The compressive stress enables a stable mixed crystal system of a rhombohedral structure and a tetragonal structure with a high aspect ratio (c/a).

If the in-plane lattice parameter is less than 0.360 nm, a compressive stress may be applied excessively to interfere with the piezoelectric strain. On the contrary, if the in-plane lattice parameter is more than 0.385 nm, the compressive stress is too small to expect the effect.

Examples of the single crystal substrate satisfying the requirements for the in-plane lattice parameter include lanthanum strontium gallate ($LaSrGaO_4$), strontium lanthanum aluminate ($SrLaAlO_4$), calcium neodymium aluminate ($CaNdAlO_4$), lanthanum aluminate ($LaAlO_3$), neodymium aluminate ($NdAlO_3$), yttrium aluminate ($YAlO_3$), and yttria-stabilized zirconia (YSZ). Likening the single-crystal substrate to a cubic crystal system of a pseudo-perovskite type structure, the (100) plane is exposed in the surface, thereby obtaining the in-plane lattice parameter in the above-mentioned range. Those materials may be used in combination or may be laminated to form a multi-layered structure. In order to double as one electrode of the piezoelectric element, the substrate may be doped with a conductive metal or a conductive metal oxide, or the substrate surface may be laminated therewith.

The more preferred range of the in-plane lattice parameter is determined depending on the type of the piezoelectric thin film used in the piezoelectric element according to the present invention. When the piezoelectric thin film is constituted by a perovskite type metal oxide containing Bi at the A-site, the most preferable substrate is a $LaAlO_3$ single-crystal substrate. The $LaAlO_3$ single-crystal substrate is identified by a rhombohedral structure or a pseudo-cubic structure, and when the (100) plane is exposed in the surface, the in-plane lattice parameter is 0.379 nm to 0.380 nm. This in-plane lattice parameter is most suited to the a-axis lattice parameter of a tetragonal structure of the Bi-based perovskite type metal oxide.

Further, the lower electrode 2 and the upper electrode 4 of the piezoelectric element are each formed of a conductive layer having a thickness of about 5 nm to 2000 nm. A material for each of the electrodes is not particularly limited, and a material used in a piezoelectric element in ordinary cases suffices. Examples of the material include metals of Ti, Pt, Ta, Ir, Sr, In, Sn, Au, Al, Fe, Cr, and Ni, and oxides of those metals. Each of the lower electrode 2 and the upper electrode 4 may be formed of one kind thereof, or may be formed by laminating two or more kinds thereof.

Further, it is preferred that at least one of the lower electrode 2 and the upper electrode 4 be formed of a perovskite type metal oxide represented by $M1RuO_3$ (M1 represents at least one kind selected from the group consisting of Sr, Ba, and Ca) or $Sr_{(1-z)}M2_zCoO_3$ (M2 represents at least one kind selected from the group consisting of La, Pr, Sm, and Nd and z satisfies 0≤z<1).

When applying such a conductive metal oxide to the lower electrode 2 or the upper electrode 4, crystal lattice matching in the contact interface with the piezoelectric thin film 3 is enhanced so that piezoelectricity and drive durability of the piezoelectric element can be expected to increase. In particular the case where the lower electrode 2 is the above-mentioned conductive oxide, the lower electrode 2 serves to promote the perovskite crystallization of the piezoelectric thin film 3, with the result that the insulation property and piezoelectricity of the piezoelectric element can be expected to increase.

In particular, it is preferred that the lower electrode 2 provided in contact with both of the piezoelectric thin film 3 and the substrate 1 be formed of $Sr_{(1-z)}La_zCoO_3$ (z satisfies 0≤z<1). $Sr_{(1-z)}La_zCoO_3$ is excellent in conductivity as an electrode and can maintain the in-plane lattice parameter of the substrate, as well as being excellent in smoothness of the electrode surface. In view of this, an ideal value of z representing the compositions of Sr and La is 0.5. Further, it is preferred that the thickness of the lower electrode 2 made of the above-mentioned material be 10 nm or more to 100 nm or less.

If the thickness of the lower electrode 2 is smaller than 10 nm, the conductivity as an electrode may become too low. On the contrary, if the thickness of the lower electrode 2 is larger than 100 nm, the maintenance of the in-plane lattice parameter and the smoothness of the electrode surface may be adversely affected.

The lower electrode 2 and the upper electrode 4 may each be formed by application and baking by a liquid phase film-forming method such as a chemical solution deposition method, or by a vapor phase film-forming method such as pulse lasering, sputtering, or vapor deposition. In addition, each of the lower electrode 2 and the upper electrode 4 may be used after having been patterned into a desired shape.

The piezoelectric thin film 3 may similarly be used in the element after having been patterned into a desired shape.

The piezoelectric element according to the present invention can be used in a device such as a piezoelectric sensor, an ultrasonic vibrator, a piezoelectric actuator, an inkjet head, a ferroelectric memory, or a capacitor.

Next, a manufacturing method for a piezoelectric element according to the present invention is described. According to the present invention, the manufacturing method for a piezoelectric element including, on a substrate, a piezoelectric thin film and a pair of electrodes provided in contact with the piezoelectric thin film, includes: forming a first electrode on the substrate, the substrate including a single-crystal substrate selectively (100) oriented, in which an in-plane lattice parameter of a unit cell of the single-crystal substrate is 0.360 nm or more to 0.385 nm or less in a surface of the single-crystal substrate; forming the piezoelectric thin film on the first electrode; and forming a second electrode on the piezoelectric thin film, in which the forming the piezoelectric thin film includes applying a precursor solution of an organometallic compound to the single-crystal substrate, followed by drying, and heating the single-crystal substrate at 430° C. or lower under an excess oxygen atmosphere, thereby obtaining a thin film formed of a crystallized metal oxide.

Because the substrate used in the manufacturing method for a piezoelectric element is a single-crystal substrate selectively (100) oriented, the first electrode and the piezoelectric thin film provided on the substrate surface can also be selectively oriented in the same orientation. When the piezoelectric thin film is selectively oriented, the polarization moments are aligned in the thickness direction to expect the enhancement of the piezoelectric effects. The (100) plane means the state in which any one of the planes of a unit cell is exposed in the substrate surface when likening the crystal system of the single-crystal substrate to a pseudo-cubic structure of the perovskite type structure.

In particular the case where the in-plane lattice parameter of the single-crystal substrate is 0.360 nm or more to 0.385 nm or less in the substrate surface, a compressive stress is generated in each of the a-axis direction and the b-axis direction of a unit cell of the metal oxide during epitaxial growth of the piezoelectric thin film. A unit cell has a fixed number of metallic elements contained therein, and hence the unit cell of the tetragonal structure elongates the c-axis lattice parameter so as to maintain its volume. Accordingly, the compressive stress exerts an effect of the stable existence of a mixed crystal system of a rhombohedral structure and a tetragonal structure with a high aspect ratio (c/a). The effect can also be obtained if the first electrode is interposed between the substrate surface and the piezoelectric thin film.

If the in-plane lattice parameter is less than 0.360 nm, the a-axis lattice parameter is so suppressed that the impurity phase may be generated in the perovskite type structure. On the contrary, if the in-plane lattice parameter is more than 0.385 nm, the effect of suppressing the c-axis lattice parameter cannot be expected.

The first electrode refers to an electrode on the substrate side of the pair of electrodes constituting the piezoelectric element according to the present invention. In the embodiment of FIG. 1, the first electrode corresponds to the lower electrode 2. Similarly, a second electrode corresponds to the upper electrode 4 in FIG. 1.

The piezoelectric element is manufactured by stacking on the substrate the first electrode, the piezoelectric thin film, and the second electrode in this order, thereby manufacturing a piezoelectric element with good adhesion between the members. Examples of the method of stacking the first electrode, the piezoelectric thin film, and the second electrode include a liquid phase method, such as a chemical solution deposition method or a hydrothermal synthesis method, and a gas phase method, such as a sputtering film-forming method, a pulsed laser deposition method, a vapor deposition method, or an metalorganic chemical vapor deposition method.

The crystallization of the piezoelectric thin film according to the present invention is performed at 430° C. or lower under an excess oxygen atmosphere. A lower limit of the crystallization temperature, which varies depending on the composition of the piezoelectric thin film, is typically 400° C. or higher, more preferably 420° C. or higher.

The crystallization of the piezoelectric thin film at a temperature within the above-mentioned range can suppress the emergence of impurity phases that are of non-perovskite structures with non-piezoelectricity. Besides, the crystallization of the piezoelectric thin film at a temperature within the above-mentioned range makes the homogeneous growth of crystal grains, thereby providing a piezoelectric thin film having a flat and smooth film surface.

In addition, when heating is performed under the excess oxygen atmosphere, the crystallization of the piezoelectric thin film is promoted even in a low temperature region with a maximum of 430° C. or lower. The term "excess oxygen atmosphere" as used herein refers to an atmosphere having a higher oxygen concentration than that of an ordinary air atmosphere, for example, an atmosphere having an oxygen concentration in a reactor of 21 vol % or more, preferably 25 vol % or more. A preferably applicable manner of the crystallization under the excess oxygen atmosphere is that the crystallization while causing an oxygen gas to flow in the reactor or the crystallization while causing an mixed gas with oxygen to flow in the reactor.

It is more preferably that an ozone component be incorporated into the excess oxygen atmosphere for further promoting the crystallization of the piezoelectric thin film. The term "ozone component" comprehends an ozone gas, an ozone ion, and an ozone radical. Because the ozone component has higher oxidizing power than that of oxygen, the ozone component has an effect of reducing the amount of the impurity phases of the piezoelectric thin film so that the insulation property and piezoelectricity of the piezoelectric element may be improved. The excess oxygen atmosphere containing the ozone component can easily be obtained by using the oxygen gas and a commercially available, industrial ozone generator or the like.

A tube furnace, an electric furnace, an infrared annealing oven, a hot plate, or the like can be used in the crystallizing step. Of those, the tube furnace is suitable for the introduction of the excess oxygen atmosphere.

Further, it is preferred that the first electrode be formed of $Sr_{(1-z)}La_zCoO_3$ (z satisfies $0 \leq z < 1$) by a pulsed laser deposition method. $Sr_{(1-z)}La_zCoO_3$ is excellent in conductivity as an electrode and can maintain the in-plane lattice parameter of the substrate, as well as being excellent in smoothness of the electrode surface. In view of this, an ideal value of z representing the compositions of Sr and La is 0.5.

The pulsed laser deposition method as used herein refers to a generic name for film-forming methods with which a metal oxide grows from the vapor on the substrate by using plasma, which is generated when a pulsed laser within several tens of nanoseconds (ns) enters a target material. The term "pulsed laser deposition method" comprehends a film-forming method generally called pulsed laser vapor deposition method, pulsed laser film-forming method, laser ablation method, or molecular beam epitaxy method.

In the case of forming an electrode of $Sr_{(1-z)}La_zCoO_3$ by the pulsed laser deposition method, an ideal thickness thereof is 10 nm or more to 100 nm or less. The reason is as described above in the description of the piezoelectric element.

In the case of forming the electrode of $Sr_{(1-z)}La_zCoO_3$ by the pulsed laser deposition method, the oxygen partial pressure in a vacuum chamber is preferably 20 mTorr or more to 100 mTorr or less, more preferably 30 mTorr or more to 50 mTorr or less. The $Sr_{(1-z)}La_zCoO_3$ electrode obtained under the oxygen partial pressure within the above-mentioned range exhibits epitaxial growth with respect to the in-plane lattice parameter of the single-crystal substrate, and has a single crystal orientation.

Further, it is preferred that, in the manufacturing method for the piezoelectric element according to the present invention, the step of forming the piezoelectric thin film be performed by the chemical solution deposition method.

The term "chemical solution deposition method" as used herein refers to a generic name for film-forming methods each involving applying a precursor solution for a target metal oxide onto a substrate, and crystallizing the applied solution under heat to provide the target metal oxide. In general, film-forming methods called a CSD method, a sol-gel method, and a metalorganic decomposition method are included in the term, and are hereinafter generically referred to as chemical solution deposition methods. The chemical solution deposition methods are each a film-forming method excellent in precision control of metal composition.

A precursor solution of a metal oxide applied on the substrate contains at least a metal component constituting a target metal oxide. For example, a precursor solution for $Bi_x(Fe_{1-y}Co_y)O_3$ as a target contains at least Bi, Fe, and Co. Those metallic elements are incorporated into the precursor solution in the form of a hydrolyzable or thermally-degradable organometallic compound. For example, typical examples thereof include metal complexes of the metals such as a metal alkoxide, organic acid salt, and β-diketone complex. As the metal complex, in addition to amine complexes, there may be used various other complexes. Examples of the β-diketone include acetylacetone (=2,4-pentanedione), heptafluorobutanoylpivaloylmethane, dipivaloylmethane, trifluoroacetylacetone, and benzoylacetone.

In the manufacturing method for the piezoelectric element according to the present invention, it is preferred that, of the organometallic compounds, at least a metal salt of 2-ethylhexanoate be incorporated into the precursor solution. In the 2-ethylhexanoate salts of the respective metals, hydrolysis reaction between the metals easily progresses, and hence a dense and homogeneous piezoelectric thin film can be obtained.

It is preferred that the composition ratio of metal components in the precursor be the same molar ratio as in a target. For example, in a precursor solution for $Bi(Fe_{1-y}Co_y)O_3$ as a target, it is preferred that the difference between the total content of Fe and Co and the content of Bi be 1 mol % or less. With such procedure, the charge balance of the piezoelectric thin film to be finally obtained is established, and hence the insulation property is improved. In addition, the procedure has such an action that the arrangement of perovskite type crystals is promoted and hence the amount of the impurity phases is reduced. This is attributable to a feature of the chemical solution deposition method in which the arrangement of metal atoms in an intermediate state before crystallization affects the arrangement of the metal atoms after the crystallization.

The organometallic compounds as precursors for the respective component metals are collectively dissolved or dispersed in a proper solvent. Thus, a precursor solution for a composite organic metal oxide (oxide containing two or more metals) of which the piezoelectric thin film is formed is prepared. In addition, the solvent used in the preparation of the precursor solution is appropriately selected from various known solvents in consideration of dispersibility and an application characteristic.

Examples of the solvent used for preparing the precursor solution include a xylene-based solvent, a toluene-based solvent, an alcohol-based solvent, an ether-based solvent, a cellosolve-based solvent, an amide-based solvent, and a nitrile-based solvent. Of those, the xylene-based solvent is preferably used. The amount of the solvent contained in the precursor solution of the present invention is not particularly limited. However, a dense piezoelectric thin film is easily obtained when the amount of the solvent is adjusted so that the concentration of a composite metal oxide component converted to the chemical formula represented by the general formula (1) falls within the range of about 0.05 mol/Kg to 1 mol/Kg.

The precursor solution may contain an additive such as a stabilizer in addition to the organometallic compound and solvent. Examples of the stabilizer include β-diketones, ketone acids, lower alkyl esters of those ketone acids, oxyacids, lower alkyl esters of those oxyacids, oxyketones, α-amino acids, and alkanolamines.

The precursor solution is applied onto the first electrode. A known application method such as spin coating, dip coating, bar coating, or spray coating can be employed as a method of applying the precursor solution. A relative humidity in this case is preferably 60% or less. A relative humidity of more than 60% is not preferred because hydrolysis progresses rapidly in the applied raw material solution on the substrate and hence a precipitate is observed in the applied layer in some cases.

The number of times of application is determined by a relationship between a coating thickness and a desired thickness of the piezoelectric thin film. Note that, the application is performed multiple times (multi-layer coating) in the chemical solution deposition method of the present invention, and a coating thickness per layer is preferably 8 nm or more to 30 nm or less. The microstructure of a metal oxide thin film obtained by the chemical solution deposition method is largely affected by the coating thickness per layer. In the present invention, when the coating thickness is set to fall within the above-mentioned range so that the film may be of a stacked structure, the film becomes dense and homogenous. As a result, the effects that the crystal phases become homogeneous and the insulation property is improved can be obtained.

The chemical solution deposition method is performed by multi-layer coating. The term "multi-layer" refers to two or more layers, preferably 5 or more to 60 or less layers.

When the application is performed multiple times, it is more preferred that a drying step be performed during each time period between application and the next application. Although the drying step may serve also as the step of crystallizing the piezoelectric thin film, it is preferred that the step be performed at a low temperature involving no crystallization, for example, 300° C. or lower. A dryer, a hot plate, a tube furnace, an electric furnace, or the like can be used in the drying step.

Figure 2A:
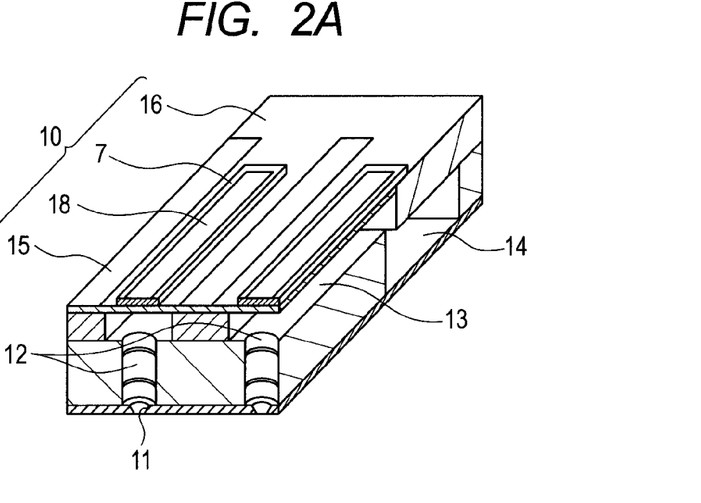
FIGS. 2A and 2B are schematic views illustrating an embodiment of a structure of a liquid discharge head according to the present invention.

A liquid discharge head according to the present invention is a liquid discharge head including the above-mentioned piezoelectric element. FIG. 2A is a schematic view illustrating the liquid discharge head. The liquid discharge head includes: discharge ports 11; connecting holes 12 connecting individual liquid chambers 13 and the discharge ports 11; a common liquid chamber 14; a diaphragm 15; and a piezoelectric element 10. The piezoelectric element 10 has a rectangular shape as illustrated in FIG. 2A, but may have the shape of an ellipse, a circle, or a parallelogram, apart from the rectangle. In general, a piezoelectric thin film 7 also adopts the shape according to the shape of the individual liquid chamber.

Figure 2B:
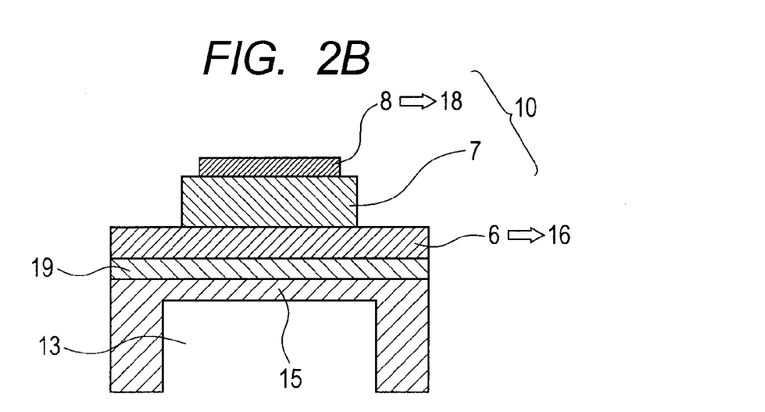

Referring to FIG. 2B, the piezoelectric element 10 constituting the liquid discharge head according to the present invention and its vicinity are described in detail. FIG. 2B is a cross-sectional view of the piezoelectric element in the width direction of the liquid discharge head of FIG. 2A. The piezoelectric element 10 has a rectangle shape in cross-section, but may have a trapezoidal or inverted trapezoidal shape. In FIGS. 2A and 2B, a first electrode 6 and a second electrode 8 correspond to a lower electrode 16 and an upper electrode 18, respectively, but the first electrode 6 and the second electrode 8 constituting the piezoelectric element 10 according to the present invention may be either of the lower electrode 16 and the upper electrode 18. A buffer layer 19 may be interposed between the diaphragm 15 and the lower electrode 16.

In the above-mentioned liquid discharge head, the diaphragm moves vertically with the expansion and contraction of the piezoelectric thin film to apply pressure to the liquid in the individual liquid chamber, to thereby discharge the liquid from the discharge ports. The liquid discharge head according to the present invention is applicable for use in the manufacture of electronic devices, in addition to a printer.

The diaphragm has a thickness of 0.5 μm or more to 15 μm or less, preferably 1.0 μm or more to 8 μm or less. The material of the diaphragm is not limited but preferred to be silicon. Further, the buffer layer and the electrode layer above silicon may be part of the diaphragm. The silicon of the diaphragm may be doped with boron or phosphorus.

The buffer layer has a thickness of 300 nm or less, preferably 200 nm or less.

The size of the discharge port is 5 µm or more to 40 µm or less in diameter. The shape of the discharge port is circular, but may be star, square, or triangular.

Figure 3A:
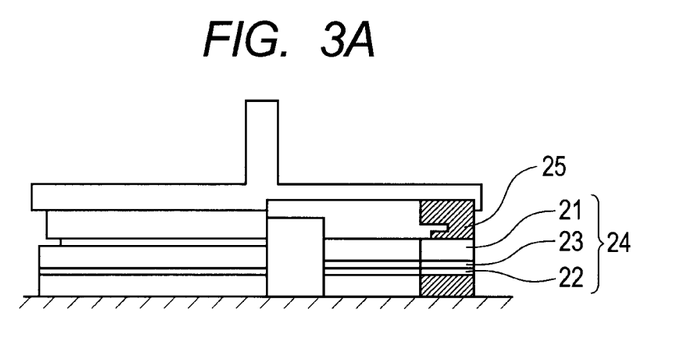
FIGS. 3A and 3B are schematic views illustrating an embodiment of a structure of an ultrasonic motor according to the present invention.
Figure 3B:
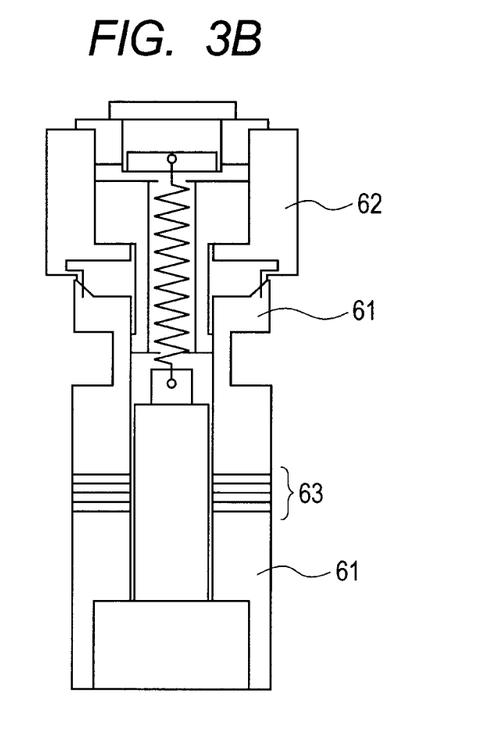

Next, an ultrasonic motor using the piezoelectric element according to the present invention is described. FIGS. 3A and 3B are schematic views illustrating an embodiment of a structure of the ultrasonic motor according to the present invention.

FIG. 3A illustrates the ultrasonic motor formed of the single piezoelectric element according to the present invention. The ultrasonic motor includes a transducer 24, a rotor 25, and an output shaft integrated with the rotor 25. The transducer 24 is formed by bonding a piezoelectric element 22 according to the present invention to an elastic metal ring 21 by an organic adhesive 23 (epoxy-based adhesive, cyanoacrylate adhesive, etc.). The rotor 25 receives a pressure force from a pressure spring (not shown) to be brought into contact with a slide surface of the transducer 24.

When the piezoelectric element according to the present invention is applied with AC voltages from a two-phase power source (the phases are different by $\pi/2$), a flexural progressive wave is generated in the transducer 24 so that the respective points on the slide surface of the transducer 24 make an elliptical motion. When the rotor 25 is brought into pressure contact with the slide surface of the transducer 24, the rotor 25 receives a frictional force from the transducer 24 and rotates in the direction of elliptical motion on the transducer slide surface. A driven member (not shown) is bonded to the output shaft by a coupling or the like and is driven by receiving a rotational force of the rotor 25. This type of motor uses the principle that, when the piezoelectric element is bonded to the elastic member like a metal, the elastic member is bent because of the expansion and contraction of the piezoelectric element by the piezoelectric lateral effect caused by voltage application to the piezoelectric thin film.

Further, referring to FIG. 3B, an ultrasonic motor in which the piezoelectric element has a laminate structure is exemplified. In FIG. 3B, a transducer 61 made of a metallic material is constituted by interposing multiple piezoelectric elements 63 according to the present invention between cylinder metal blocks and by fastening the metal blocks with bolts to sandwich and fix the multiple piezoelectric elements 63. In the transducer 61, when a driving piezoelectric film of the piezoelectric element is applied with AC voltages having different phases, two orthogonal vibrations are excited and combined to form a circular vibration for driving at the distal end portion of the transducer. Note that, a constricted circumferential groove is formed in the tip of the transducer 61 so as to increase the displacement of vibration for driving. A rotor 62 is brought into pressure contact with the transducer 61 by a pressure spring to obtain a frictional force for driving.

As described above, the piezoelectric element according to the present invention is suitably applicable to the liquid discharge head and the ultrasonic motor.

Hereinafter, the present invention is described more specifically by way of examples. However, the present invention is not limited by the following examples.

(Manufacture Examples 1 to 9 of Precursor Solution)

Mixed solutions having metal molar ratios shown in Table 1 were each prepared as a precursor solution for forming the piezoelectric thin film and the piezoelectric element according to the present invention.

For preparing the precursor solution, there were mixed a xylene solution of bismuth 2-ethylhexanoate, a xylene solution of iron 2-ethylhexanoate, a xylene solution of aluminum 2-ethylhexanoate, and a xylene solution of cobalt 2-ethylhexanoate, each having a concentration of 0.2 mol/Kg. The mixed solution was heated and refluxed for 1 hour at 120° C. under a nitrogen atmosphere to promote the progress of a thermolysis reaction. Xylene was added to the resultant so that the concentration of the oxides as perovskite type metal oxide might be 0.2 mol/Kg, to thereby obtain a precursor solution.

The precursor solutions of Manufacture Examples 1 to 9 each had a difference between the total concentration of Fe or Al, and Co components and the concentration of Bi of 1 mol % or less.

(Manufacture Examples 10 to 15 of Precursor Solution)

Precursor solutions having metal molar ratios shown in Table 1 were each prepared in the same manner as in Manufacture Example 1 for comparison with the present invention.

TABLE 1

|  | Bi (mol) | Fe (mol) | Al (mol) | Co (mol) |
| --- | --- | --- | --- | --- |
| Manufacture Example 1 | 100 | 95 | 0 | 5 |
| Manufacture Example 2 | 100 | 92.5 | 0 | 7.5 |
| Manufacture Example 3 | 100 | 90 | 0 | 10 |
| Manufacture Example 4 | 100 | 87.5 | 0 | 12.5 |
| Manufacture Example 5 | 100 | 85 | 0 | 15 |
| Manufacture Example 6 | 100 | 0 | 95 | 5 |
| Manufacture Example 7 | 100 | 0 | 90 | 10 |
| Manufacture Example 8 | 100 | 0 | 85 | 15 |
| Manufacture Example 9 | 100 | 45 | 45 | 10 |
| Manufacture Example 10 | 100 | 100 | 0 | 0 |
| Manufacture Example 11 | 100 | 97 | 0 | 3 |
| Manufacture Example 12 | 100 | 80 | 0 | 20 |
| Manufacture Example 13 | 100 | 70 | 0 | 30 |
| Manufacture Example 14 | 130 | 90 | 0 | 10 |
| Manufacture Example 15 | 90 | 90 | 0 | 10 |

(Manufacture Example of Substrate and First Electrode)

To form the piezoelectric thin film and the piezoelectric element according to the present invention, a substrate and a first electrode each having a structure shown in Table 2 were prepared. A substrate A and a substrate B are a substrate provided with the first electrode on its surface, whereas a substrate C is a substrate without an electrode.

The in-plane lattice parameter in the surface of a $LaAlO_3$ single crystal used in the substrates A, B, and C was 0.379 nm. A $Sr_{0.5}La_{0.5}CoO_3$ electrode and a $SrRuO_3$ electrode in Table 2 were about 60 nm in thickness provided by a pulsed laser deposition method. Substrate temperature was 500° C. and oxygen partial pressure was 30 mTorr.

Further, a substrate D and a first electrode each having a structure shown in Table 2 were prepared for comparison with the present invention. The in-plane lattice parameter in the surface of a $SrTiO_3$ single crystal used in a substrate D was 0.390 nm. The manufacturing method for a first electrode provided on the surface of the substrate D was the same as in the substrate B.

TABLE 2

|  | Substrate | First electrode |
|---|---|---|
| Substrate A with electrodes | (100)-oriented LaAlO$_3$ single crystal | (100)-oriented Sr$_{0.5}$La$_{0.5}$CoO$_3$ film |
| Substrate B with electrodes | (100)-oriented LaAlO$_3$ single crystal | (100)-oriented SrRuO$_3$ film |
| Substrate C | (100)-oriented LaAlO$_3$ single crystal | — |
| Substrate D with electrodes | (100)-oriented SrTiO$_3$ single crystal | (100)-oriented SrRuO$_3$ film |

EXAMPLE 1

A piezoelectric thin film made of a perovskite type metal oxide was formed by a chemical solution deposition method using the precursor solution of Manufacture Example 1 shown in Table 1 and the substrate A with electrodes shown in Table 2.

First, the precursor solution was applied to the surface of the substrate with a spin coater (3000 rpm). The applied layer was heat-treated at 250° C. for 5 minutes to dry the solvent. The heat treatment process was performed with an electric dryer under an air atmosphere.

Hereinafter, in the same manner as in the foregoing, the applying step and the drying step were repeated to form second to twentieth layers. Finally, the entire substrate having the multiple applied layers was placed in an infrared-annealing tube furnace. An oxygen gas was introduced into the tube furnace via a commercially available, industrial ozone generator at a flow rate of 1 L/min (corresponding to an oxygen concentration in the furnace of 50 vol % to 80 vol %). Note that, the generated ozone concentration of the ozone generator was about 100 g/m$^3$. The substrate placed in the tube furnace was heat-treated at 430° C. for 60 minutes to crystallize the film provided on the substrate, thereby obtaining the piezoelectric thin film according to the present invention.

X-ray diffraction measurement (XRD) including 2θ/θ measurement and reciprocal lattice measurement was carried out to find that the piezoelectric thin film was a perovskite type metal oxide having a mixed crystal system of a tetragonal structure selectively (001) oriented and a rhombohedral structure selectively (100) oriented. The a-axis lattice parameter and the c-axis lattice parameter of the tetragonal structure were 0.379 nm and 0.460 nm, respectively, with c/a=1.214. In the 2θ/θ measurement, the integrated intensity of the diffraction peak resulting from the (001) plane of the tetragonal structure and the integrated intensity of the diffraction peak resulting from the (100) plane of the rhombohedral structure were compared. The result showed that the mixture percentage of the tetragonal structure was about 5%.

X-ray fluorescence analysis (XRF) was carried out to measure the content of metallic elements in the piezoelectric thin film. It was found that, when the total molar amount of iron and cobalt was normalized to 1, a content ratio "Bi/Fe/Co" was 1.00/0.95/0.05. Noted that, other metals than those three kinds were not detected.

Figure 4:
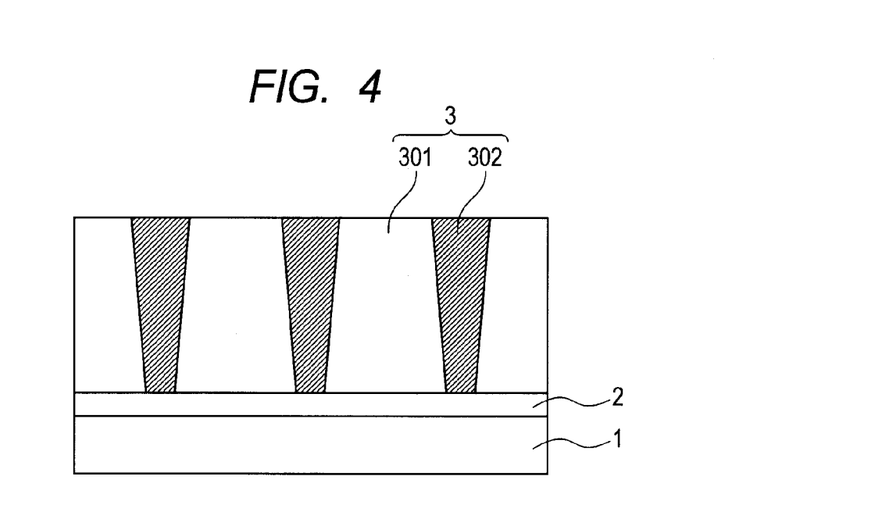
FIG. 4 is a schematic view in vertical cross-section illustrating an image of a piezoelectric thin film observed under a transmission electron microscope according to Example 1 of the present invention.

The thickness of the piezoelectric thin film measured by a contact profilometer was 400 nm. In other words, the thickness of a coated film per layer was 20 nm. A transmission electron microscope (TEM) was used to observe the cross-section of the piezoelectric thin film according to the present invention. FIG. 4 is a schematic view illustrating the state of a cross-sectional image. In FIG. 4, reference numerals 1, 2, and 3 denote the substrate, the lower electrode, and the piezoelectric thin film according to the present invention, respectively. The piezoelectric thin film was classified into a first trapezoidal region 301 and a second inverted-trapezoidal region 302 based on the gray level of electron diffraction. Those two regions each form a columnar structure. It was found from an FFT pattern showing the electron diffraction in those two regions that the first region corresponded to a rhombohedral structure and the second region corresponded to a tetragonal structure. The ratio between the first region 301 and the second region 302 estimated from the area ratio in the cross-sectional image was about 19:1.

The cross-sectional measurement by TEM requires the sample slicing step. Taking into account that this step mitigates a stress in the film to change the crystalline state, the lattice parameters in the above-mentioned two regions were not determined from the TEM image. However, it was confirmed that epitaxial growth matching with the in-plane lattice parameter of the lower electrode was observed in both the two regions. In addition, it was confirmed that the rhombohedral structure in the first region was (100) oriented and the tetragonal structure in the second region was (001) oriented. EDX measurement showed that there was no significant difference in composition between the compositions of the metal oxides in the first region and the second region.

The surface of the piezoelectric thin film was scanned with an atomic force microscope (AFM) to obtain the image of crystal grains. A root mean square roughness Rq corresponding to JIS Standard B0601 calculated from a height difference in a 2,000-nm square image was 1.79 nm.

EXAMPLES 2 to 13

The piezoelectric thin films according to the present invention were each formed in the same manner as in Example 1 except that the precursor solution, the substrate, the number of coatings, the crystallization atmosphere, and the crystallization temperature were changed. Table 3 shows the manufacture conditions of each example.

In Example 13, the crystallization was performed at 430° C. in a tube furnace in which an oxygen gas was introduced at a flow rate of 1 L/min. The oxygen gas was not introduced via an ozone generator.

XRD measurement showed that each of the piezoelectric thin films had a mixed crystal system of a tetragonal structure selectively (001) oriented and a rhombohedral structure selectively (100) oriented. The amount of impurity phases other than a perovskite type structure was extremely small. Further, it was confirmed from the shift in peak position in XRD that Co was introduced in a perovskite skeleton.

Further, evaluations were carried out on the value of c/a of the tetragonal structure, the thickness measured by a contact profilometer, the composition ratio of metallic elements measured by XRF, the existence of a columnar structure by cross-sectional TEM observation, and a root mean square roughness Rq measured by AFM.

The results are shown in Table 4. In the "rhombohedral" column, the mark "OK" indicates that a rhombohedral structure selectively (100) oriented was confirmed in each sample, and the mark "NG" indicates that the rhombohedral structure was not confirmed. In the "tetragonal c/a" column, the value of c/a is filled in the case where a tetragonal structure selectively (001) oriented was confirmed in each sample, otherwise the mark "NG" is filled. In the "columnar structure" column, the mark "OK" indicates that one part of the rhombohedral structure and the tetragonal structure formed a columnar structure in the cross-sectional image by TEM. The composition ratio of metals shows a value when the total molar amount of Fe, Al, and Co was normalized to 1.

COMPARATIVE EXAMPLES 1 to 11

The precursor solutions of Manufacture Examples 1, 3, 5, and 10 to 15 shown in Table 1 and the substrates A and B shown in Table 2 were used to form metal oxide thin films for comparison similarly to Example 1. The crystallization atmosphere and the crystallization temperature were changed as appropriate as described in Table 1.

XRD measurement showed that each of the metal oxide thin films of Comparative Example 1 and 2 was a perovskite type metal oxide which had a rhombohedral structure selectively (100) oriented but had no tetragonal structure.

Each of the metal oxide thin films of Comparative Examples 3 and 4 was a perovskite type structure metal oxide which had a tetragonal structure selectively (001) oriented but had no rhombohedral structure. In the sample of Comparative Example 4, impurity phases of non-perovskite type crystal were mixed.

The results of XRD measurement of Comparative Examples 5 and 6 showed that the amount of impurity phases was so large that it could no longer be deemed that a perovskite crystal structure was dominant. No such peak shift that Co was introduced into a perovskite skeleton was observed.

Comparative Examples 7 and 8 provide a metal oxide thin film produced by using the substrate D, in which the in-plane lattice parameter was 0.390 nm in the surface. Each of the thin films was a perovskite type metal oxide which had a rhombohedral structure selectively (100) oriented but had no tetragonal structure.

Comparative example 9 provides a film obtained by the crystallization at 430° C. under an ordinary air atmosphere, and Comparative Example 10 provides a film obtained by the crystallization at 430° C. under an excess nitrogen atmosphere. XRD measurement showed that an impurity phase of non-perovskite type crystal was a main phase, and it was difficult to analyze a peak resulting from a perovskite type structure.

Comparative Example 11 provides a film obtained by the crystallization at 550° C. under an excess oxygen atmosphere containing an ozone component. XRD measurement showed that the film had a rhombohedral structure selectively (100) oriented but had a large amount of impurity phases of non-perovskite type crystal.

Of the above Comparative Examples, the films of Comparative Examples 1 to 4, 7, 8, and 11, whose main phase was estimated to be a perovskite type metal oxide, was evaluated for structure and composition similarly to Examples 1 to 13. The results are shown in Table 4.

TABLE 3

| | Precursor solution | Substrate | Coatings | Atmosphere | Crystallization temperature |
|---|---|---|---|---|---|
| Example 1 | Manufacture Example 1 | A | 20 layers | Ozone-containing oxygen | 430° C. |
| Example 2 | Manufacture Example 2 | A | 20 layers | Ozone-containing oxygen | 430° C. |
| Example 3 | Manufacture Example 3 | A | 20 layers | Ozone-containing oxygen | 430° C. |
| Example 4 | Manufacture Example 4 | A | 20 layers | Ozone-containing oxygen | 430° C. |
| Example 5 | Manufacture Example 5 | A | 20 layers | Ozone-containing oxygen | 430° C. |
| Example 6 | Manufacture Example 6 | A | 13 layers | Ozone-containing oxygen | 420° C. |
| Example 7 | Manufacture Example 7 | A | 13 layers | Ozone-containing oxygen | 420° C. |
| Example 8 | Manufacture Example 8 | A | 13 layers | Ozone-containing oxygen | 420° C. |
| Example 9 | Manufacture Example 9 | A | 13 layers | Ozone-containing oxygen | 420° C. |
| Example 10 | Manufacture Example 1 | B | 5 layers | Ozone-containing oxygen | 430° C. |
| Example 11 | Manufacture Example 5 | B | 5 layers | Ozone-containing oxygen | 430° C. |
| Example 12 | Manufacture Example 3 | C | 35 layers | Ozone-containing oxygen | 430° C. |
| Example 13 | Manufacture Example 3 | A | 20 layers | Oxygen flow | 430° C. |
| Comparative Example 1 | Manufacture Example 10 | A | 20 layers | Ozone-containing oxygen | 430° C. |
| Comparative Example 2 | Manufacture Example 11 | A | 20 layers | Ozone-containing oxygen | 430° C. |
| Comparative Example 3 | Manufacture Example 12 | A | 20 layers | Ozone-containing oxygen | 430° C. |
| Comparative Example 4 | Manufacture Example 13 | A | 20 layers | Ozone-containing oxygen | 430° C. |
| Comparative Example 5 | Manufacture Example 14 | A | 20 layers | Ozone-containing oxygen | 430° C. |
| Comparative Example 6 | Manufacture Example 15 | A | 20 layers | Ozone-containing oxygen | 430° C. |

TABLE 3-continued

|  | Precursor solution | Substrate | Coatings | Atmosphere | Crystallization temperature |
|---|---|---|---|---|---|
| Comparative Example 7 | Manufacture Example 1 | D | 20 layers | Ozone-containing oxygen | 430° C. |
| Comparative Example 8 | Manufacture Example 5 | D | 20 layers | Ozone-containing oxygen | 430° C. |
| Comparative Example 9 | Manufacture Example 3 | A | 20 layers | Air | 430° C. |
| Comparative Example 10 | Manufacture Example 3 | A | 20 layers | Nitrogen flow | 430° C. |
| Comparative Example 11 | Manufacture Example 3 | A | 20 layers | Ozone-containing oxygen | 550° C. |

TABLE 4

|  | Rhombohedral | Tetragonal c/a | Columnar structure | Thickness (nm) | Bi (mol) | Fe (mol) | Al (mol) | Co (mol) | 25y + 2 | Rq/nm |
|---|---|---|---|---|---|---|---|---|---|---|
| Example 1 | OK | 1.214 | OK | 400 | 1.00 | 0.95 | 0.00 | 0.05 | 3.25 | 1.79 |
| Example 2 | OK | 1.214 | OK | 400 | 1.00 | 0.92 | 0.00 | 0.08 | 4.00 | 1.98 |
| Example 3 | OK | 1.212 | OK | 400 | 1.00 | 0.90 | 0.00 | 0.10 | 4.50 | 2.03 |
| Example 4 | OK | 1.211 | OK | 420 | 1.00 | 0.88 | 0.00 | 0.12 | 5.00 | 2.08 |
| Example 5 | OK | 1.210 | OK | 430 | 1.00 | 0.85 | 0.00 | 0.15 | 5.75 | 2.88 |
| Example 6 | OK | 1.258 | OK | 240 | 1.05 | 0.00 | 0.95 | 0.05 | 3.25 | 2.33 |
| Example 7 | OK | 1.253 | OK | 260 | 1.05 | 0.00 | 0.90 | 0.10 | 4.50 | 3.11 |
| Example 8 | OK | 1.233 | OK | 260 | 1.05 | 0.00 | 0.85 | 0.15 | 5.75 | 3.98 |
| Example 9 | OK | 1.216 | OK | 220 | 1.03 | 0.45 | 0.45 | 0.10 | 4.50 | 3.21 |
| Example 10 | OK | 1.160 | OK | 100 | 0.98 | 0.95 | 0.00 | 0.05 | 3.25 | 1.66 |
| Example 11 | OK | 1.154 | OK | 110 | 0.99 | 0.85 | 0.00 | 0.15 | 5.75 | 2.25 |
| Example 12 | OK | 1.215 | OK | 750 | 1.01 | 0.90 | 0.00 | 0.10 | 4.50 | 4.45 |
| Example 13 | OK | 1.212 | OK | 440 | 1.02 | 0.90 | 0.00 | 0.10 | 4.50 | 3.75 |
| Comparative Example 1 | OK | NG | NG | 400 | 1.00 | 1.00 | 0.00 | 0.00 | 2.00 | 1.71 |
| Comparative Example 2 | OK | NG | NG | 400 | 1.00 | 0.97 | 0.00 | 0.03 | 2.75 | 1.72 |
| Comparative Example 3 | NG | 1.241 | NG | 450 | 1.00 | 0.80 | 0.00 | 0.20 | 7.00 | 3.85 |
| Comparative Example 4 | NG | 1.235 | NG | 520 | 1.00 | 0.70 | 0.00 | 0.30 | 9.50 | 15.5 |
| Comparative Example 7 | OK | NG | NG | 390 | 1.01 | 0.95 | 0.00 | 0.05 | 3.25 | 1.85 |
| Comparative Example 8 | OK | NG | NG | 400 | 1.01 | 0.85 | 0.00 | 0.15 | 5.75 | 3.22 |
| Comparative Example 11 | OK | NG | NG | 500 | 0.94 | 0.90 | 0.00 | 0.10 | 4.50 | 21.5 |

(Manufacture of Elements from Examples 1 to 5, 7, and 13)

A platinum electrode of 120 μm in diameter was provided on each surface of the piezoelectric thin films of Examples 1 to 5, 7, and 13 by a sputtering film-forming method, thereby producing the piezoelectric element according to the present invention.

(Manufacture of Element of Example 12)

Figure 6:
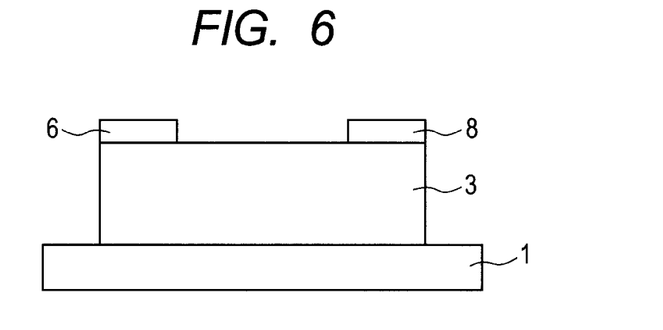
FIG. 6 is a schematic view in vertical cross-section illustrating another exemplary embodiment of a piezoelectric element according to the present invention.

A pair of platinum electrodes were provided at the ends of the surface of the piezoelectric thin film of Example 12 by a sputtering film-forming method, thereby producing the piezoelectric element as shown in FIG. 6 according to the present invention. The references in FIG. 6 are the same as those in FIGS. 1 and 2B. Each of the electrodes was patterned into a rectangular electrode in 0.25 mm by 1.5 mm, and the distance between the electrodes was 5 mm.

(Manufacture of Elements from Comparative Examples 2, 3, 7, and 8)

A platinum electrode of 120 μm in diameter was provided on each surface of the metal oxide thin films of Examples 2, 3, 7, and 8 by a sputtering film-forming method, thereby producing the element for comparison.

(Evaluation by Electric Measurement)

Electric measurement was carried out on the piezoelectric elements of Examples 1 to 5, 7, and 13 and the elements of Comparative Examples 2, 3, 7, and 8.

Each of the elements was measured for values representing the characteristics of a piezoelectric element at room temperature (25° C.), for example, a leak current, P-E hysteresis, and a piezoelectric constant. The measurement results of the P-E hysteresis and the piezoelectric constant are shown in Table 5.

The leak current was determined by measuring leak currents in such a range that an applied voltage per thickness of a thin film sandwiched between electrodes was ±2,000 kV/cm, and recording the maximum leak current. All of the piezoelectric elements of Examples 1 to 5, 7, and 13 and the elements of Comparative Examples 2, 3, 7, and 8 exhibited good insulation property with the maximum leak current of 10 mA/cm or less.

The P-E hysteresis measurement was carried out for determining whether or not a target element had ferroelectricity and insulation property at room temperature. A material with ferroelectricity has piezoelectricity. Specifically, the piezoelectric element according to the present invention or a comparative element was applied with an external electric field having a maximum value of ±700 kV/cm while changing the phase to positive and negative, and the hysteresis of spontaneous polarization at that time was observed. The mark "OK" in Table 5 indicates that a hysteresis loop peculiar to a ferroelectric, in which the spontaneous polarization is reversed, was observed. The mark "NG" indicates that no ferroelectric loop was observed because of poor insulation property or that the insulation property was good but no reversal of the spontaneous polarization was observed as in the case of paraelectrics.

The piezoelectric constant was determined by room-temperature piezoelectric constant ($d_{33}$ constant) measurement with an atomic force microscope (AFM) as a displacement detector. In other words, the AFM was used to observe the strain of the piezoelectric material in such a range that an applied voltage per thickness of a thin film sandwiched between electrodes was ±1500 kV/cm. In general, the strain curve to be obtained is a closed, butterfly curve. The slope of the curve was approximated by a straight line to calculate the piezoelectric constants shown in Table 5. This technique is a well-known calculating method in the art. The mark "NG" indicates that a piezoelectric constant could not be calculated because of low piezoelectricity of the element.

TABLE 5

|  | Ferroelectricity | Piezoelectric constant d33 (pm/V) |
|---|---|---|
| Example 1 | OK | 80 |
| Example 2 | OK | 95 |
| Example 3 | OK | 115 |
| Example 4 | OK | 85 |
| Example 5 | OK | 80 |
| Example 7 | OK | 95 |
| Example 11 | OK | 75 |
| Example 13 | OK | 90 |
| Comparative Example 2 | OK | 30 |
| Comparative Example 3 | NG | NG |
| Comparative Example 7 | OK | 45 |
| Comparative Example 8 | OK | 50 |

From Table 5, each of the piezoelectric elements according to the present invention exhibits ferroelectricity and piezoelectricity in the room-temperature region. The elements of Comparative Examples 2, 7, and 8 also exhibited ferroelectricity and piezoelectricity, but the element with only a tetragonal structure of Comparative Example 3 had poor ferroelectricity and poor piezoelectricity. Further, in Comparative Examples 2, 7, and 8 with only a rhombohedral structure, the piezoelectric constants gradually increased with the increase in Co content, but in the piezoelectric element according to the present invention, the piezoelectric constant had a tendency to abruptly increase because of the effect of the mixture with a tetragonal structure.

Note that, the manufacturing method of Comparative Example 1 is similar to the manufacturing method for a BFO thin film described in "Science", 2009, vol. 326, pp. 977 to 980, but the existence of a pseudo-tetragonal structure was not observed.

When the piezoelectric element of Example 12 was applied with an alternating voltage of ±10 V between a pair of electrodes, it was confirmed that a oscillating wave was generated in the surface of the piezoelectric thin film exposed between the electrodes.

(Magnetization Measurement on Piezoelectric Thin Films of Example 5 and Comparative Example 1)

Magnetization measurement was carried out on the piezoelectric thin films of Example 5 and Comparative Example 1. A high-resolution SQUID (superconducting quantum interference device) magnetometer for magnetization measurement and analysis was used with two levels of measurement temperature, room temperature (300 K) and low temperature (20 K). The measurement results are illustrated in FIG. 5.

When measuring the magnetization of the piezoelectric thin film of Example 5 applied with an external magnetic field of ±15 kOe (kilooersteds), a ferromagnetic behavior was observed even at the room temperature. At the low temperature, the ferromagnetic behavior was more obvious and remanent magnetization was observed without an external magnetic field. Therefore, it was revealed that the piezoelectric thin film of Example 5 was a multiferroic material having ferromagnetism in addition to the above-mentioned ferroelectricity.

On the other hand, the metal oxide thin film of Comparative Example 1, which was a $BiFeO_3$ thin film having multiferroic property, did not exhibit as much of a ferromagnetic behavior as in Example 5 in the low-temperature measurement. Although not illustrated, no magnetization behavior was observed also in the room-temperature measurement.

Figure 5:
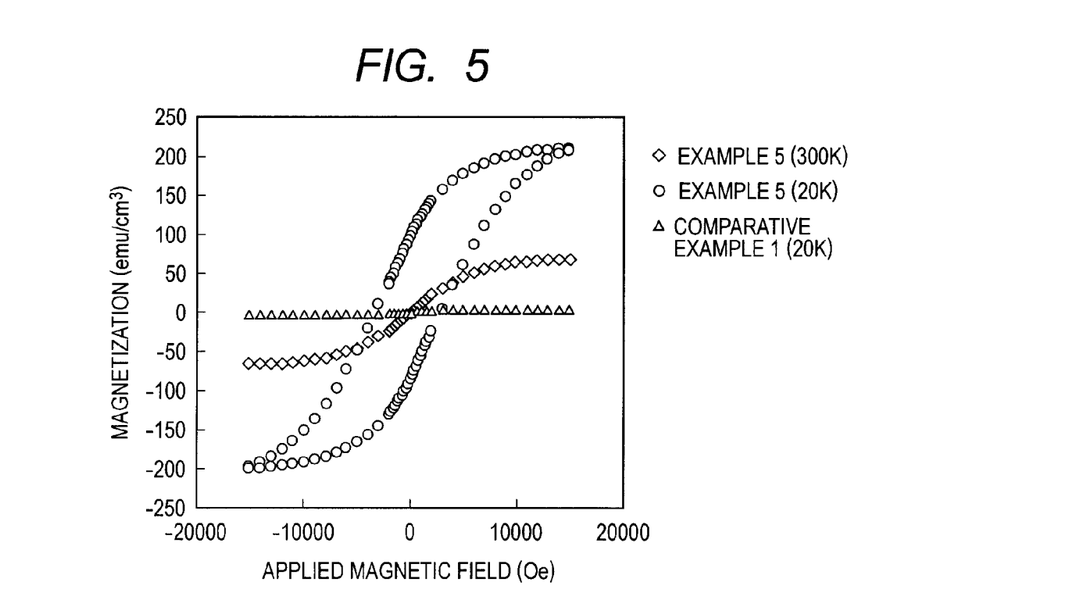
FIG. 5 is a graph illustrating a relation between magnetization and an applied magnetic field on a piezoelectric thin film according to Example 5 of the present invention and a metal oxide thin film according to Comparative Example 1.

Note that, FIG. 5 illustrates the results of in-plane magnetization measurement on the thin films of Example 5 and Comparative Example 1, but a similar magnetization behavior and a comparable level of magnetization were observed in interplanar measurement as well.

(Liquid Discharge Head and Ultrasonic Motor of Example 3)

Using the same piezoelectric thin film as in Example 3, a liquid discharge head and an ultrasonic motor illustrated in FIGS. 2A and 2B and 3A and 3B, respectively, were produced. In the liquid discharge head, the discharge of ink following an input electrical signal was confirmed. In the ultrasonic motor, the rotational behavior of a motor according to an applied alternating voltage was confirmed.

According to the present invention, the piezoelectric thin film having high piezoelectricity can be provided. Further, the present invention can provide the piezoelectric element including the above-mentioned piezoelectric thin film, the manufacturing method for the piezoelectric element, the liquid discharge head, and the ultrasonic motor.

The piezoelectric thin film according to the present invention is also applicable to MEMS technology and can be used for appliances using many ferroelectric materials and piezoelectric thin films, such as a ferroelectric memory, a ferroelectric sensor, and a piezoelectric transducer, without difficulty.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-045907, filed Mar. 2, 2010, which is hereby incorporated by reference herein in its entirety.

REFERENCE SIGNS LIST

1 Substrate
2, 16 Lower electrode

3 Piezoelectric thin film
4, 18 Upper electrode
6 First electrode
7 Piezoelectric thin film
8 Second electrode
10, 22, 63 Piezoelectric element
11 Discharge port
24 Transducer
61 Transducer
62 Rotor
301 First region
302 Second region

The invention claimed is:

1. A piezoelectric element comprising a substrate and, on the substrate, laminated in stated order:
a first electrode;
a piezoelectric thin film comprising a perovskite-type metal oxide; and
a second electrode,
wherein the perovskite-type metal oxide has a mixed crystal system having at least a rhombohedral structure and a tetragonal structure at 25° C.,
wherein the perovskite-type metal oxide contains a metal oxide represented by general formula (1):

$$Bi_x(M_{1-y}Co_y)O_3 \qquad (1),$$

where M represents at least one kind of metal selected from Fe and Al, and x and y satisfy $0.95 \leq x \leq 1.25$ and $0.05 \leq y \leq 0.15$,
wherein a ratio between an a-axis lattice parameter and a c-axis lattice parameter of the tetragonal structure satisfies $1.15 \leq c/a \leq 1.30$, and
wherein the piezoelectric thin film is lead-free.

2. The piezoelectric element according to claim 1, wherein the metal M in the general formula (1) is Fe.

3. The piezoelectric element according to claim 1, wherein the tetragonal structure of the piezoelectric thin film is (001) oriented, and wherein the rhombohedral structure of the piezoelectric thin film is (100) oriented.

4. The piezoelectric element according to claim 1, wherein at least one part of the tetragonal structure and the rhombohedral structure of the piezoelectric thin film forms a columnar structure.

5. The piezoelectric element according to claim 1, wherein the piezoelectric thin film has a thickness of 50 nm to 10 μm.

6. The piezoelectric element according to claim 1, wherein a root mean square roughness Rq of a surface of the piezoelectric thin film and y in the general formula (1) satisfy a relationship of general formula (2):

$$0 < Rq \leq 25y+2 \qquad (2).$$

7. The piezoelectric element according to claim 1, wherein the substrate comprises a (100) oriented single-crystal substrate, and wherein an in-plane lattice parameter of a unit cell of the single-crystal substrate is 0.360 nm to 0.385 nm in a surface of the single-crystal substrate.

8. The piezoelectric element according to claim 7, wherein the substrate comprises at least a $LaAlO_3$ single crystal.

9. The piezoelectric element according to claim 1, wherein at least one of the first electrode and the second electrode comprises a perovskite-type metal oxide represented by one of $M1RuO_3$, where M1 represents at least one kind selected from the group consisting of Sr, Ba, and Ca, and $Sr_{(1-z)}M2_zCoO_3$, where M2 represents at least one kind selected from the group consisting of La, Pr, Sm, and Nd and z satisfies $0 \leq z < 1$.

10. The piezoelectric element according to claim 9, wherein the at least one of the first electrode and the second electrode is provided in contact with both of the piezoelectric thin film and the substrate, and comprises a perovskite-type metal oxide represented by $Sr_{(1-z)}La_zCoO_3$ where z satisfies $0 \leq z < 1$.

11. A liquid discharge head, comprising the piezoelectric element according to claim 1.

12. An ultrasonic motor, comprising the piezoelectric element according to claim 1.

* * * * *